(12) United States Patent
Hagihara et al.

(10) Patent No.: US 6,630,279 B2
(45) Date of Patent: Oct. 7, 2003

(54) POSITIVE PHOTORESIST COMPOSITION

(75) Inventors: Mitsuo Hagihara, Kanagawa (JP); Toshiaki Tachi, Kanagawa (JP); Kenji Maruyama, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/327,361

(22) Filed: Dec. 26, 2002

(65) Prior Publication Data

US 2003/0152861 A1 Aug. 14, 2003

(30) Foreign Application Priority Data

Dec. 26, 2001 (JP) ......................................... 2001-394417

(51) Int. Cl.[7] .............................. G03F 7/023; G03F 7/30
(52) U.S. Cl. ...................... 430/191; 430/165; 430/192; 430/193; 430/326
(58) Field of Search ................................ 430/165, 191, 430/192, 193, 326

(56) References Cited

U.S. PATENT DOCUMENTS

| 5,407,779 | A | | 4/1995 | Uetani et al. | |
|---|---|---|---|---|---|
| 5,629,128 | A | | 5/1997 | Shirakawa et al. | |
| 5,726,217 | A | | 3/1998 | Ichikawa et al. | |
| 5,747,218 | A | * | 5/1998 | Momota et al. | 430/192 |
| 5,912,102 | A | * | 6/1999 | Kawata et al. | 430/191 |
| 6,265,129 | B1 | * | 7/2001 | Takahashi et al. | 430/192 |
| 6,300,033 | B1 | * | 10/2001 | Suzuki et al. | 430/192 |
| 6,379,859 | B2 | * | 4/2002 | Suzuki et al. | 430/191 |
| 6,406,827 | B2 | * | 6/2002 | Suzuki et al. | 430/191 |

* cited by examiner

Primary Examiner—John S. Chu
(74) Attorney, Agent, or Firm—Sughrue Mion, PLLC

(57) ABSTRACT

A composition includes (A) an alkali-soluble resin; and (B) (b-1) a compound of Formula (I):

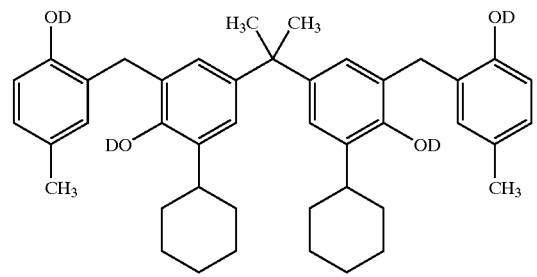

wherein Ds are each a hydrogen atom or a naphthoquinonediazidosulfonyl group; and (b2) a quinonediazide ester of, for example, methyl gallate.

3 Claims, No Drawings

POSITIVE PHOTORESIST COMPOSITION

BACKGROUND OF THE INVENTION

1. Field of the Invention

The present invention relates to a positive photoresist composition that is excellent in properties as a resist (resist properties) such as sensitivity, definition, focal depth range properties (depth of focus; DOF), exposure margin, and density-dependent variations in size and is particularly useful in the formation of ultrafine resist patterns of not more than 0.35 µm.

2. Description of the Related Art

Certain positive photoresist compositions containing an alkali-soluble novolak resin and a non-benzophenone naphthoquinonediazido-group-containing compound (photosensitizer) have been proposed as photoresist materials that can form ultrafine resist patterns of not more than half a micron, particularly of not more than 0.35 µm, in photolithography using i-line (365 nm).

Among such photosensitizers, esters (quinonediazide esters) of a low-molecular phenolic compound having a "linear"phenol skeleton comprising combined four to seven benzene rings with a 1,2-naphthoquinonediazidosulfonic acid compound have been reported as photosensitizers having a high definition (e.g., Japanese Patent Laid-Open Nos. 6-167805; 7-152152; 7-159990; 7-168355; 8-129255; 8-245461; 8-339079; 9-114093; 12-29208; and 12-29209). However, a demand has been made on positive photoresist compositions that have further excellent resist properties such as sensitivity, definition, focal depth range properties (DOF), and exposure margin in the formation of ultrafine resist patterns of not more than 0.35 µm, smaller than the wavelength of i-line (365 nm).

In the manufacture of logic integrated circuits (logic ICs) comprising a mixture of regular, dense patterns such as line-and-space (L&S) patterns and irregular, isolation patterns, the positive photoresist composition must form resist patterns with less "density-dependent variations in size", i.e., must form such dense patterns and isolation patterns in exact accordance with set dimensions with a good shape under the same exposure conditions.

In this connection, certain photolithographic techniques using short-wavelength light sources such as KrF (248 nm) and ArF (193 nm) have been proposed in the formation of resist patterns of not more than 0.35 µm. However, these techniques require a significant capital investment to build plants and equipment in production lines using these light sources, and the capital investment cannot be recovered. Accordingly, the i-line (365 nm) photolithographic process, which is now mainstream, must be employed for some time in the future.

SUMMARY OF THE INVENTION

Accordingly, it is an object of the present invention to provide a positive photoresist composition that can yield ultrafine resist patterns of not more than half a micron, particularly of not more than 0.35 µm, in photolithography using i-line (365 nm) and is excellent in resist properties such as sensitivity, definition, focal depth range properties (DOF), exposure margin, and density-dependent variations in size.

After intensive investigations to achieve the above objects, the present inventors have found that a positive photoresist composition including an alkali-soluble resin and a mixture of specific quinonediazide esters (photosensitizers) can yield resist patterns with satisfactory resist properties such as sensitivity, definition, focal depth range properties (DOF), exposure margin, and density-dependent variations in size even in the formation of ultrafine resist patterns of not more than 0.35 µm, smaller than the wavelength of i-line (365 nm). The present invention has been accomplished based on these findings.

Specifically, the present invention provides a positive photoresist composition including (A) an alkali-soluble resin ingredient; and (B) a quinonediazide ester ingredient, wherein the ingredient (B) includes:

(b1) a quinonediazide ester represented by following Formula (I):

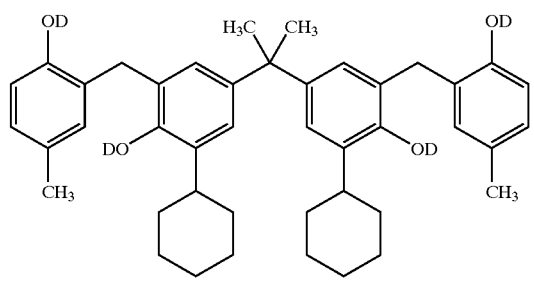

wherein each of Ds is independently a hydrogen atom or a 1,2-naphthoquinonediazido-5-sulfonyl group, where at least one of Ds is a 1,2-naphthoquinonediazido-5-sulfonyl group; and (b2) a quinonediazide ester represented by following Formula (II):

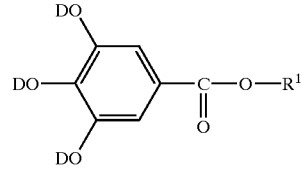

wherein each of Ds is independently a hydrogen atom or a 1,2-naphthoquinonediazido-5-sulfonyl group, where at least one of Ds is a 1,2-naphthoquinonediazido-5-sulfonyl group; and $R^1$ is an alkyl group containing 1 to 6 carbon atoms.

The positive photoresist composition may further include (C) an alkali-soluble low-molecular compound having a phenolic hydroxyl group and having a molecular weight less than or equal to 1000.

The ratio of the quinonediazide ester (b2) to the quinonediazide ester (b1) in the ingredient (B) is preferably from 1% to 50% by weight.

The positive photoresist compositions of the present invention can yield ultrafine resist patterns of not more than half a micron, particularly of not more than 0.35 µm, and are excellent in resist properties such as sensitivity, definition, focal depth range properties (DOF), exposure margin, and density-dependent variations in size in photolithography using i-line (365 nm).

DETAILED DESCRIPTION OF THE INVENTION

Ingredient (A): Alkali-soluble Resins

Alkali-soluble resins for use as the ingredient (A) in the present invention are not specifically limited and can be freely chosen from those conventionally used as film-forming substances in positive photoresist compositions. Among them, preferred alkali soluble resins are condensates of aromatic hydroxy compounds with aldehydes and/or ketones, as well as polyhydroxystyrenes and derivatives thereof.

Such aromatic hydroxy compounds include, but are not limited to, phenol; m-cresol, p-cresol, o-cresol; 2,3-xylenol, 2,5-xylenol, 3,5-xylenol, 3,4-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these compounds can be used alone or in combination.

The aldehydes include, but are not limited to, formaldehyde, paraformaldehyde, trioxane, acetaldehyde, propionaldehyde, butyraldehyde, trimethylacetaldehyde, acrolein (acrylaldehyde), crotonaldehyde, cyclohexanecarbaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Among these aldehydes, formaldehyde is preferred for its high availability. To improve thermal resistance of the positive photoresist compositions, a combination use of a hydroxybenzaldehyde and formaldehyde is typically preferred.

The ketones include, but are not limited to, acetone, methyl ethyl ketone, diethyl ketone, and diphenyl ketone. Each of these ketones can be used alone or in combination. An appropriate combination use of an aldehyde with a ketone is also acceptable.

The condensates of aromatic hydroxy compounds with aldehydes and/or ketones can be prepared according to a conventional procedure in the presence of an acidic catalyst. Such acidic catalysts include, but are not limited to, hydrochloric acid, sulfuric acid, formic acid, oxalic acid, and p-toluenesulfonic acid.

The polyhydroxystyrenes and derivatives thereof include, but are not limited to, vinylphenol homopolymers, and copolymers of vinylphenol and a copolymerizable comonomer. Such comonomers include, for example, acrylic acid derivatives, acrylonitrile, methacrylic acid derivatives, methacrylonitrile, styrene, a-methylstyrene, p-methylstyrene, o-methylstyrene, p-methoxystyrene, p-chlorostyrene, and other styrene derivatives.

Of these alkali-soluble resins for use in the present invention as the ingredient (A), preferred resins are alkali-soluble novolak resins having a weight average molecular weight (Mw) from 2000 to 20000 and more preferably from 3000 to 12000. Among them, alkali-soluble novolak resins prepared by condensation of m-cresol and p-cresol with formaldehyde and those prepared by condensation of m-cresol, p-cresol and 2,5-xylenol with formaldehyde are typically preferred for the preparation of positive photoresist compositions having a high sensitivity and a wide exposure margin.

Ingredient (B): Quinonediazide Esters

By using the quinonediazide ester (b1) represented by Formula (I) and the quinonediazide ester (b2) represented by Formula (II) in combination according to the present invention, resist patterns with the satisfactory resist properties can be formed even in the formation of ultrafine resist patterns of not more than 0.35 μm.

The average esterification percentage of the quinonediazide ester (b1) is preferably from 40% to 90% and more preferably from 45% to 75%. If the average esterification percentage is less than 40%, the resulting positive photoresist composition may have a decreased film residual rate and definition, and if it exceeds 90%, the positive photoresist composition may have a decreased sensitivity and may yield increased scum.

The average esterification percentage of the quinonediazide ester (b2) is preferably equal to or more than 50% and more preferably equal to or more than 70%. If the average esterification percentage is less than 50%, the positive photoresist composition may exhibit a decreased film residual rate and definition.

Among such quinonediazide esters (b2), typically preferred are quinonediazide esters of methyl gallate, ethyl gallate and propyl gallate.

The ingredient (B) may further comprise additional quinonediazide esters (e.g., quinonediazide esters of phenolic compounds having a benzophenone skeleton or polyphenol compounds represented by Formula (III)) in addition to the quinonediazide esters (b1) and (b2). The amount of such additional quinonediazide esters is preferably less than or equal to 80% by weight and more preferably less than or equal to 50% by weight based on the total weight of the ingredient (B) in order not to adversely affect the advantages of the present invention.

The ratio of the quinonediazide ester (b2) to the quinonediazide ester (b1) is preferably from 1% to 50% by weight and more preferably from 5% to 30% by weight. If the ratio is less than 1% by weight, the positive photoresist composition may not yield a separated resist pattern upon shift of the focus to the plus side in a focal depth range property (DOF) test. In contrast, if it exceeds 50% by weight, the positive photoresist composition may exhibit a decreased film residual rate upon shift of the focus to the plus side.

The amount of the ingredient (B) in the composition of the present invention is preferably from 10% to 60% by weight and more preferably from 25% to 45% by weight, relative to the total weight of the ingredient (A) and the ingredient (C) added according to necessity. If the amount of the ingredient (B) is excessively small, the positive photoresist composition may not yield images in exact accordance with the pattern and may have deteriorated transfer property. If it is excessively large, the positive photoresist composition may exhibit a decreased sensitivity and definition, and the resulting resist film may have deteriorated uniformity.

Ingredient (C): Sensitizers

For higher sensitivity, the compositions of the present invention preferably further comprise an alkali-soluble low-molecular compound (sensitizer) having a phenolic hydroxyl group and having a molecular weight less than or equal to 1000 as an ingredient (C).

Such ingredients (C) are not specifically limited and include, for example, phenolic compounds conventionally used in positive photoresist compositions for i-line photolithography to improve the sensitivity.

Examples of such compounds are polyphenol compounds represented by following Formula (III):

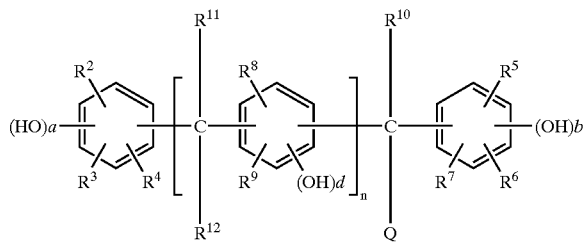

wherein each of $R^2$, $R^3$, $R^4$, $R^5$, $R^6$, $R^7$, $R^8$, and $R^9$ is independently a hydrogen atom, a halogen atom, an alkyl group containing 1 to 6 carbon atoms, an alkoxy group containing 1 to 6 carbon atoms, or a cycloalkyl group containing 3 to 6 carbon atoms;

each of $R^{10}$, $R^{11}$, and $R^{12}$ is independently a hydrogen atom or an alkyl group containing 1 to 6 carbon atoms;

Q is a hydrogen atom or an alkyl group containing 1 to 6 carbon atoms, or Q is combined with $R^{10}$ to form a cycloalkyl group containing 3 to 6 carbon members or a residue represented by following Formula (IV):

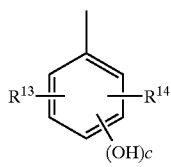

wherein each of $R^{13}$ and $R^{14}$ is independently a hydrogen atom, a halogen atom, an alkyl group containing 1 to 6 carbon atoms, an alkoxy group containing 1 to 6 carbon atoms, or a cycloalkyl group containing 3 to 6 carbon atoms; and c is an integer from 1 to 3;

each of a and b is independently an integer from 1 to 3;

d is an integer from 0 to 3; and n is an integer from 0 to 3.

More specifically, preferred examples of the ingredient (C) are 1-[1,1-bis(4-methylphenyl)ethyl]-4-[1-(4-hydroxyphenyl)isopropyl]benzene, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcinol, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. Among them, typically preferred are 1-[1,1-bis(4-methylphenyl)ethyl]-4-[1-(4-hydroxyphenyl)isopropyl]benzene, bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis(3,5-dimethyl-4-hydroxyphenylmethyl)-6-methylphenol, and 4,6-bis[1-(4-hydroxyphenyl)isopropyl]resorcinol.

The amount of the ingredient (C), if any, in the composition of the present invention is preferably from 10% to 60% by weight and more preferably from 20% to 50% by weight, relative to the weight of the ingredient (A).

Where necessary, the composition of the present invention may further comprise any of compatible additives such as ultraviolet absorbents for inhibition of halation and surfactants for prevention of striation within ranges not adversely affecting the objects of the invention. Such ultraviolet absorbents include, for example, 2,2',4,4'tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, and curcumin. The surfactants include, but are not limited to, Fluorad FC-430 and FC-431 (trade names, available from Fluorochemical-Sumitomo 3M Co.), EFTOP EF122A, EF122B, EF122C and EF126 (trade names, available from Tohkem Products Corporation) and other fluorine-containing surfactants.

The positive photoresist composition of the present invention is preferably used as a solution prepared by dissolving each of the ingredients (A) and (B), as well as the ingredient (C) and other additional ingredients added according to necessity, in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, and monomethyl ethers, monoethyl ethers, monopropyl ethers, monobutyl ethers and monophenyl ethers of these compounds, and other polyhydric alcohols and derivatives thereof; dioxane and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. Of these solvents, preferred solvents are acetone, methyl ethyl ketone, cyclohexanone, methyl isoamyl ketone, 2-heptanone and other ketones; and ethyl lactate, methyl acetate, ethyl acetate, butyl acetate, methyl pyruvate, ethyl pyruvate, methyl methoxypropionate, ethyl ethoxypropionate, and other esters.

The positive photoresist composition of the present invention is preferably used in practice, for example, in the following manner: Each of the ingredients (A) and (B), as well as the ingredient (C) and other additional ingredients added according to necessity, is dissolved in an appropriate solvent as mentioned above to yield a coating solution; the coating solution is then applied, using a spinner or the like, onto a substrate such as a silicon wafer or a substrate having an antireflection coating, and is then dried to form a photosensitive layer; next, the photosensitive layer is irradiated and is exposed with i-line light through a desired mask pattern; and the exposed portions of the photosensitive layer are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be illustrated in further detail with reference to several examples and comparative examples below, which are not intended to limit the scope of the invention.

Example 1

Ingredient (A): An alkali-soluble resin [a novolak resin having a weight average molecular weight (Mw) in terms of polystyrene of 6000 and being prepared according to a conventional procedure in the presence of p-toluenesulfonic acid as a catalyst using 4 moles of m-cresol, 2 moles of p-cresol, 4 moles of 2,5-xylenol, and formaldehyde].

Ingredient (B): A 10:1 by weight mixture of b1 and b2-1, wherein b1 is an ester with an esterification percentage of 50% prepared from 1 mole of a compound corresponding to the phenolic compound of Formula (I), except that all Ds are hydrogen atoms, and 2 moles of 1,2-naphthoquinonediazido-5-sulfonyl chloride (5-NQD); and b2-1 is an ester with an esterification percentage of 100% prepared from 1 mole of methyl gallate and 3 moles of 5-NQD Ingredient (C): A sensitizer, 1-[1,1-bis(4-methylphenyl) ethyl]-4-[1-(4-hydroxyphenyl)isopropyl]benzene In a solvent mixture of ethyl lactate and butyl acetate (9:1 by weight) were dissolved 100 parts by weight of the ingredient (A), 40 parts by weight of the ingredient (B), and 42 parts by weight of the ingredient (C) and thereby yielded a solution having a concentration of 27% by weight. The solution was filtrated through a 0.2-μm membrane filter and thereby yielded a positive photoresist composition.

Examples 2 to 5 and Comparative Examples 1 to 7

A series of positive photoresist compositions were prepared by the procedure of Example 1, except that the ingredient (B) was changed to those indicated in Table 1.

The physical properties of the positive photoresist compositions obtained in Examples1 to 4 and Comparative Examples1 to 7 were determined according to the following methods. The results are shown in Table 2.

(1) Sensitivity

A sample was applied onto a silicon wafer using a spinner and was dried on a hot plate at 90° C. for 90 sec. to form a resist film 1.05 μm thick. The resist film was then irradiated with light through a mask (reticle) corresponding to a 0.35-μm resist pattern with line-and-space (L&S) of 1:1 for an increasing period from 0.1 sec. at intervals of 0.01 sec. using a reducing-type projection aligner NSR-2005i10D (available from Nikon Corporation, Japan; NA=0.57). The film was then post-exposure baked (PEB) at 110° C. for 90 sec.; was subjected to developing in a 2.38% by weight tetramethylammonium hydroxide (TMAH) aqueous solution at 23° C. for 60 sec., was washed with water for 30 sec., and was dried. In this procedure, the sensitivity was defined as the optimum exposure time period (Eop) (ms) to reproduce a 0.35-μm resist pattern with line-and-space (L&S) of 1:1.

(2) Definition

The definition was defined as the critical definition at an exposure to reproduce a 0.35-μm mask pattern.

(3) Focal Depth Range Properties (DOF)

A sample was subjected to exposure and development using a reducing-type projection aligner NSR-2005i10D (available from Nikon Corporation, Japan; NA=0.57) at an exposure of Eop [the exposure time period to reproduce a 0.35-μm mask pattern with a line-and-space (L&S) of 1:1] as a standard exposure, where the focus was shifted up and down at this exposure. The obtained resist pattern was subjected to an SEM photographic observation. Based upon the SEM photograph, the DOF was defined as the maximum value (μm) of the focal shift (defocus) to yield a 0.35-μm rectangular resist pattern within a variation of +10% of the set size.

(4) Underexposure Margin

A sample was applied onto a silicon wafer using a spinner and was dried on a hot plate at 90° C. for 90 sec. to form a resist film 1.05 μm thick. The resist film was then irradiated with light through a mask (reticle) corresponding to a 0.35-μm resist pattern with line and space (L&S) of 1:1 for an increasing period from 0.1 sec. at intervals of 0.01 sec., using a reducing-type projection aligner NSR-2005i10D (available from Nikon Corporation, Japan; NA=0.57). The film was then post-exposure baked (PEB) at 110° C. for 90 sec., was subjected to developing in a 2.38% by weight TMAH aqueous solution at 23° C. for 60 sec., was washed with water for 30 sec., and was dried. In this procedure, the underexposure margin was defined as [Eop-Es], wherein Es (ms) is the minimum exposure time period to yield a separated pattern after development; and Eop is defined as above.

(5) Density-dependent Variation in Size

An isolation pattern was formed at a standard exposure time period Eop (the time period to reproduce a 0.35-μm pattern with a line and space of 1:1) using a mask corresponding to a 0.35-μm isolation pattern. The width (X) of the obtained isolation pattern was measured, and the density-dependent variation in size was defined as the absolute value of the difference between the measured width of the pattern and the ideal pattern width (0.35 μm) according to the following equation:

$$\text{Density-dependent variation in size} = |0.35 - X|$$

wherein X is the measured width of the isolation pattern.

TABLE 1

|  | Ingredient (B) (weight ratio) | Amount of Ingredient (B) |
|---|---|---|
| Example 1 | b1:b2-1 (10:1) | 40 |
| Example 2 | b1:b2-2 (10:1) | 40 |
| Example 3 | b1:b2-3 (10:1) | 40 |
| Example 4 | b1:b2-1 (10:2) | 40 |
| Example 5 | b1:b2-1 (10:3) | 40 |
| Com. Ex. 1 | b1 | 40 |
| Com. Ex. 2 | b2-1 | 40 |
| Com. Ex. 3 | b1:b3 (10:1) | 40 |
| Com. Ex. 4 | b4:b2-1 (10:1) | 40 |
| Com. Ex. 5 | b5:b2-1 (10:1) | 40 |
| Com. Ex. 6 | b4 | 40 |
| Com. Ex. 7 | b5 | 40 |

Wherein b1 is an ester with an esterification percentage of 50% prepared from 1 mole of a phenolic compound corresponding to Formula (I), except that all Ds are hydrogen atoms, and 2 moles of 5-NQD;

b2-1 is an ester with an esterification percentage of 100% prepared from 1 mole of methyl gallate and 3 moles of 5-NQD;

b2-2 is an ester with an esterification percentage of 100% prepared from 1 mole of ethyl gallate and 3 moles of 5-NQD;

b2-3 is an ester with an esterification percentage of 100% prepared from 1 mole of propyl gallate and 3 moles of 5-NQD;

b3 is an ester with an esterification percentage of 75% prepared from 1 mole of bis(2,4-dihydroxyphenyl) methane and 3 moles of 5-NQD;

b4 is an ester with an esterification percentage of 50% prepared from 1 mole of bis[2-hydroxy-3-(2-hydroxy-5-methylbenzyl)-5-methylphenyl]methane and 2 moles of 5-NQD; and b5 is an ester with an esterification percentage of 50% prepared from 1 mole of bis[2,5-dimethyl-3-(4-hydroxy-5-methylbenzyl)-4-hydroxyphenyl]methane and 2 moles of 5-NQD.

TABLE 2

|  | Sensitivity (ms) | Definition (μm) | DOF (μm) | Underexposure Margin (ms) | Density-dependent variation in size (μm) |
|---|---|---|---|---|---|
| Ex. 1 | 450 | 0.30 | 1.4 | 80 | 0.020 |
| Ex. 2 | 470 | 0.32 | 1.2 | 60 | 0.041 |
| Ex. 3 | 490 | 0.34 | 1.2 | 60 | 0.045 |
| Ex. 4 | 430 | 0.32 | 1.2 | 70 | 0.035 |
| Ex. 5 | 400 | 0.32 | 1.2 | 70 | 0.040 |
| Com. Ex. 1 | 500 | 0.32 | 1.0 | 50 | 0.060 |
| Com. Ex. 2 | — | — | — | — |  |
| Com. Ex. 3 | 400 | 0.34 | 0.8 | 40 | 0.070 |
| Com. Ex. 4 | 440 | 0.32 | 0.8 | 30 | 0.100 |
| Com. Ex. 5 | 400 | 0.32 | 1.0 | 40 | 0.070 |
| Com. Ex. 6 | 470 | 0.32 | 0.8 | 30 | 0.120 |
| Com. Ex. 7 | 430 | 0.32 | 1.0 | 40 | 0.090 |

In Comparative Example 2, no resist pattern was formed.

While the present invention has been described with reference to what are presently considered to be the preferred embodiments, it is to be understood that the invention is not limited to the disclosed embodiments. On the contrary, the invention is intended to cover various modifications and equivalent arrangements included within the sprit and scope of the appended claims. The scope of the following claims is to be accorded the broadest interpretation so as to encompass all such modifications and equivalent structures and functions.

What is claimed is:

1. A positive photoresist composition comprising:

(A) an alkali-soluble resin ingredient; and (B) a quinonediazide ester ingredient,
wherein the ingredient (B) comprises:
(b1) a quinonediazide ester represented by following Formula (I):

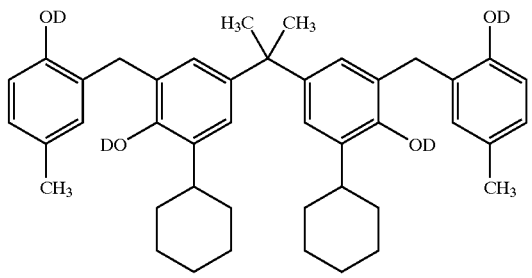

wherein each of Ds is independently a hydrogen atom or a 1,2-naphthoquinonediazido-5-sulfonyl group, where at least one of Ds is a 1,2-naphthoquinonediazido-5-sulfonyl group; and (b2) a quinonediazide ester represented by following Formula (II):

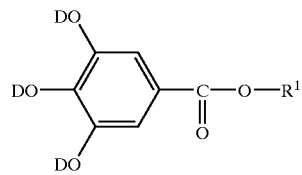

wherein each of Ds is independently a hydrogen atom or a 1,2-naphthoquinonediazido-5-sulfonyl group, where at least one of Ds is a 1,2-naphthoquinonediazido-5-sulfonyl group; and $R^1$ is an alkyl group containing 1 to 6 carbon atoms.

2. The positive photoresist composition according to claim 1, further comprising (C) an alkali-soluble low-molecular compound having a phenolic hydroxyl group and having a molecular weight less than or equal to 1000.

3. The positive photoresist composition according to claim 1, wherein the ratio of the quinonediazide ester (b2) to the quinonediazide ester (b1) in the ingredient (B) is from 1% to 50% by weight.

* * * * *